(12) United States Patent
Elayda

(10) Patent No.: US 6,438,738 B1
(45) Date of Patent: Aug. 20, 2002

(54) SYSTEM AND METHOD FOR CONFIGURING A PROGRAMMABLE LOGIC DEVICE

(75) Inventor: Bernardo Elayda, San Jose, CA (US)

(73) Assignee: Xilinx, Inc., San Jose, CA (US)

(*) Notice: Subject to any disclaimer, the term of this patent is extended or adjusted under 35 U.S.C. 154(b) by 140 days.

(21) Appl. No.: 09/664,933

(22) Filed: Sep. 19, 2000

(51) Int. Cl.[7] .............. G06F 17/50; G06F 9/45; G06F 9/445; G06F 9/24

(52) U.S. Cl. .............. 716/16; 716/18; 713/1; 713/100; 710/10; 710/104; 711/170; 717/117; 717/115; 717/118

(58) Field of Search .............. 716/1–21; 713/1–2, 713/100; 710/8–14, 104; 717/114–119; 711/170–173

(56) References Cited

U.S. PATENT DOCUMENTS

| | | | |
|---|---|---|---|
| 5,603,043 A | * 2/1997 | Taylor et al. | 712/1 |
| 5,802,290 A | * 9/1998 | Casselman | 709/201 |
| 5,852,733 A | * 12/1998 | Chien et al. | 717/113 |
| 6,058,263 A | * 5/2000 | Voth | 703/25 |
| 6,061,699 A | * 5/2000 | DiCecco et al. | 707/513 |
| 6,072,944 A | * 6/2000 | Robinson | 716/4 |
| 6,199,194 B1 | * 3/2001 | Wang et al. | 717/118 |

OTHER PUBLICATIONS

Xilinx, Inc. "The Programmable Logic Data Book," 1999, pp. 3–14 through 3–23, available from Xilinx, Inc., 2100 Logic Drive, San Jose, CA 95124.

* cited by examiner

Primary Examiner—Matthew Smith
Assistant Examiner—Phallaka Kik
(74) Attorney, Agent, or Firm—LeRoy D. Maunu

(57) ABSTRACT

System and method for configuring a programmable logic device (PLD) using an automatically generated configuration control file. A control file contains directives for configuring a PLD with a configuration bitstream, wherein the directives are in a selected language. A configuration control file generator is programmed to automatically create the control file with the directives in the selected language. In another embodiment, the particular directives and sequence of the directives that are generated are dependent on a selected configuration mode for the PLD. In performing the directives, configuration control signals are applied to the PLD, and the configuration bitstream is provided to the PLD.

18 Claims, 2 Drawing Sheets

SYSTEM AND METHOD FOR CONFIGURING A PROGRAMMABLE LOGIC DEVICE

FIELD OF THE INVENTION

The present invention generally relates to the configuration of programmable logic devices (PLDs), and more particularly to tools used in the configuration of PLDs.

BACKGROUND

In the past, configuring a programmable logic device (PLD) such as a field programmable gate array (FPGA) was relatively simple. The configuration data in the form of a configuration bitstream was stored in some form of serial, non-volatile memory. The bitstream was then loaded into the FPGA with minimal hardware and software support. This approach continues to the present. However, the vast increase in the number of gates and the increased functionality of programmable logic devices (PLDs) have greatly increased the size of configuration bitstreams, making the simple configuration method very time consuming.

Recently developed configuration interfaces, for example, the SelectMAP interface for some Xilinx® FPGAs, are made to exploit new configuration capabilities of FPGAs and to reduce the time required to configure a device with a configuration bitstream. For example, the SelectMAP interface supports partial reconfiguration, readback, partial readback and control functions such as reset. The SelectMAP interface includes an eight-bit parallel port that significantly increases the configuration bandwidth over prior PLDs. Further details on the configuration of Xilinx FPGAs can be found, for example, on pages 3–through 3–23 of the Programmable Logic Data Book 1999, available from Xilinx, Inc. of San Jose, Calif.

A number of programming interfaces for configuring PLDS have been developed in order to assist the designer in the configuration process. For example, various configuration arrangements from Xilinx include an application programming interface (API) in a software library for PLD configuration. The routines in the library are callable from an application program for exerting various configuration control functions. In another configuration arrangement, the configuration circuitry of the PLDs is made for interaction with certain microcontrollers. For example, the Virtex™ FGPA from Xilinx has configuration circuitry that is suited for interfacing with 8051 style microcontrollers, originally developed by Intel Corporation, and now available from a variety of sources. Thus, configuration can be performed by programming the microcontroller. Yet another configuration arrangement includes a GUI for invoking control commands. Even though the GUI has less flexibility than does the API, the GUI is easier to learn and use.

With the above-described configuration arrangements, the user must have a working understanding of both the configuration protocol of the PLD and the configuration directives (API, assembly language, command language). However, if the user is not familiar with the protocol and the directives, then additional effort may be required to learn how to configure the PLD. Thus, designers may be reluctant to use a new interface in view of tight development schedules.

A system and method that address the aforementioned problems, as well as other related problems, are therefore desirable.

SUMMARY OF THE INVENTION

In various embodiments, the invention provides a system and method for configuring a programmable logic device (PLD) using an automatically generated configuration control file. A control file contains directives for configuring a PLD with a configuration bitstream, wherein the directives are in a selected language. A configuration control file generator is programmed to automatically create the control file with the directives in the selected language, thereby relieving a user from having to learn the configuration protocol and language of the directives. In another embodiment, the particular directives and sequence of the directives that are generated are dependent on a selected configuration mode for the PLD. In performing the directives, configuration control signals are applied to the PLD, and the configuration bitstream is provided to the PLD.

It will be appreciated that various other embodiments are set forth in the Detailed Description and Claims that follow.

BRIEF DESCRIPTION OF THE DRAWINGS

Various aspects and advantages of the invention will become apparent upon review of the following detailed description and upon reference to the drawings, in which.

DETAILED DESCRIPTION

Various embodiments of the present invention are described in terms of the SelectMAP mode for configuring a Xilinx Virtex FPGA. While the invention is not limited in scope to SelectMAP or Xilinx FPGAs, the various embodiments will be presented in terms of specific examples involving the SelectMAP mode. Those skilled in the art will appreciate that the invention could be implemented in other programming languages, and/or applied to other configuration modes and programmable logic devices (PLDs) other than FPGAs.

Figure 1:
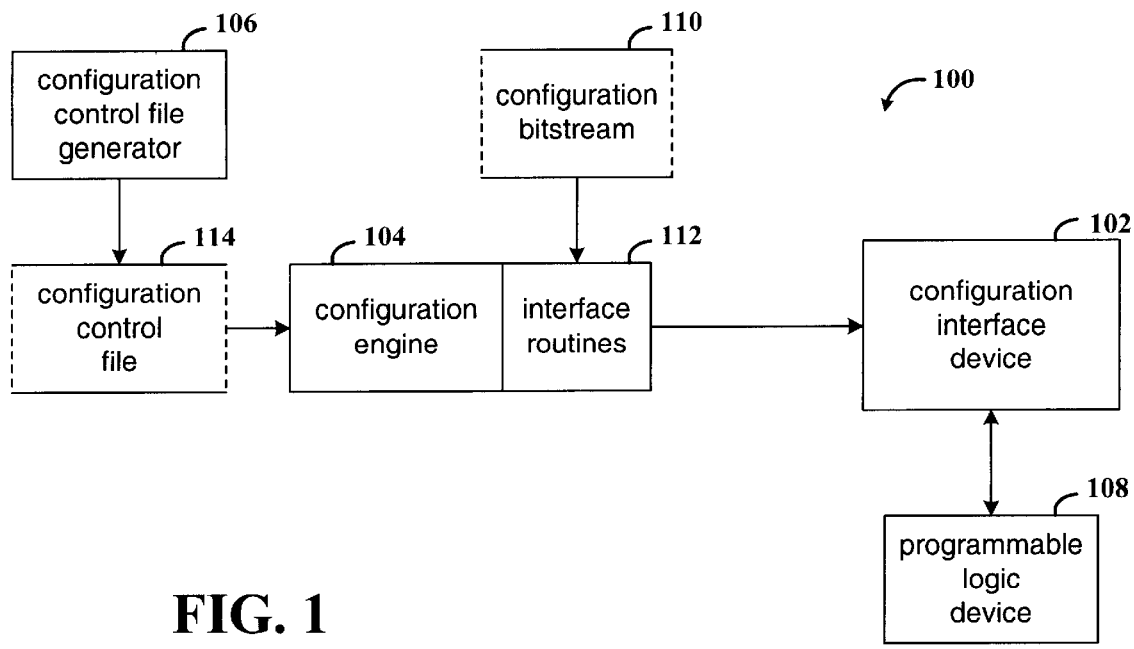
FIG. 1 is a functional block diagram of a system for configuring a PLD in accordance with one embodiment of the invention.

FIG. 1 is a functional block diagram of a system for configuring a PLD in accordance with one embodiment of the invention. System 100 generally includes configuration interface device 102, configuration engine 104, and configuration control file generator 106. Configuration interface device 102 provides a hardware connection between configuration engine 104 and programmable logic device 108 for downloading configuration bitstream 110 and reading back configuration data from PLD 108. An example interface device is the MultiLINX Cable product from Xilinx. The examples described in the present application are directed to the MutliLINX Cable.

In one embodiment, configuration engine 104 and configuration control file generator 106 are software components that are hosted by a computer system such as a workstation or personal computer. Configuration control file generator 106 produces configuration control file 114, which includes a sequence of instructions for configuring PLD 108 in a selected configuration mode. Configuration engine 104 takes the configuration control file as input and, depending on the format of the control file, interprets or executes the directives in the control file. For example, the control file may take the form of a command script that is interpreted by configuration engine 104. The commands may be mapped to interface routines that are executed to control the interface device. In another embodiment, the control file may be a program in either assembly or C language. Whether the language of the directives is a command-type or a programming language, the term "interpreting" is used herein to describe both machine execution of computer code and software interpretation configuration directives.

A sample command set for controlling the configuration of an FPGA is set forth below. The commands may be used to create a command script, which can be interpreted to configure the FPGA. In one embodiment of the invention, configuration control file generator 106 generates configuration control file 114, which is a script (having commands from the command set) for configuring the FPGA and reading back configuration data. The functions performed by the commands are indicated by the function names, and the short descriptions of the commands identify the interface routines 112 called by the commands. In other embodiments, the control file generator could be programmed to generate different types of control files. For example, an assembly language or a C language control file could be generated instead of the command script. Therefore, in addition to the command script definition, API-style statements for performing the function of the command are identified, along with functionally comparable 8051 assembly language instructions (if any). It will be appreciated that additional details of the assembly language and API statements will vary from PLD-to-PLD and the associated configuration interfaces. The command set is as follows:

```
RESET_PORTS              (no args)
-Calls C98ResetPorts ( ).
-No equivalent 8051 assembly command.
WRITE_PORT               [port#] [data]
-Calls C98WritePortData ( ).
-Equivalent to the 8051 assembly commands 'setb'
  or 'movx @Ri, A'
READ_PORT                [port#] [1-msgBox, 0-no msgBox]
-Calls C98ReadPortData ( ). A messageBox may be
  optionally used to display the read data.
-Equivalent to the 8051 assembly command
  'movx A, @Ri'
TRISTATE_PINS            [port#] [pinMask]
-Calls C98TriStatePortPins ( ).
-No equivalent 8051 assembly command
SELECT_PINS              [port#] [pinMask]
-Calls C98SelectPortPins ( ).
-No equivalent 8051 assembly command.
SETUP_AND_HOLD           [setupTime] [holdTime]
-Calls C98SetSetupAndHoldTime ( ).
-Equivalent to implementing a 8051 programming loop
  or using the 8051 timer circuits.
SET_VOLTAGE_LEVEL        [01-3.3v path, 00-2.5v path]
-Calls C98SetVoltageLevel ( ).
-No equivalent 8051 command
CONFIGURE_TARGET_FPGA [mcsfile] [bitCount (decimal)]
     [configType] [compressFlag] [compressKey]
-Calls C98ConfigureTargetFPGA ( ).
     configTypes:
          CONFIG_SLAVE_SERIAL                  1
          CONFIG_SYNC_PERIPHERAL               2
          CONFIG_ASYNC_PERIPHERAL              3
          CONFIG_SELECT_NAP                    4
     compressFlag = set to 1 to apply compression to
     data stream, set to 0 otherwise
     compressKey = 00-compress 00 characters
     FF-compress FF characters
          80-compress both 00 and FF characters
-This command is equivalent to creating an 8051
  program that loops on the 'movx @Ri, A' command,
  which can be stopped by an 8051 hardware interrupt.
READ_TARGET_FPGA [mcsfile] [bitCount (decimal)]
                      [readType]
```

-continued

```
-Calls C98ReadTargetFPGA ( ).
   readTypes:
        READ_SLAVE_SERIAL                     1
        READ_SELECT_MAP                       2
-This command is equivalent to creating an 8051
  program that loops on the 'movx A, @Ri' command,
  which can be stopped by an 8051 hardware interrupt.
DELAY_MS              [ms in decimal]
-Delay function in milliseconds.
-Equivalent to programming a loop in 8051 assembly
  or using the 8051 timers.
SINGLE_STEP
-Breakpoint function.
-Equivalent to placing a loop in 8051 assembly
  that waits for a user signal to continue the program.
READ_VERIFY           [data] [mask]
-Verifies specified data with last read data. Mask
  will be applied to both the specified data and the
  last read data.
-No equivalent 8051 command.
SET_DUT_CLOCK         [clock]
-Calls C98SetInternalLogicClock ( ).
-No equivalent 8051 command.
WRITE_FPGA            [fpga address] [data]
-Writes directly to the FPGA. CMD_BUSY flag will be
  reset prior to writing the specified data.
-No equivalent 8051 command
READ_FPGA             [fpga address] [1-msgBox, 0-no msgBox]
-Read directly from the FPGA. CMD_BUSY flag will be
  reset prior to reading the specified address. A
  messageBox may be optionally used to display the
  read data.
-No equivalent 8051 command.
TOGGLE_PIN            [pin index (decimal)] [count (decimal)]
-Calls C98TogglePin ( );
-Equivalent to the 8051 assembly command 'setb' or
  'clr'.
READ_CAPTURE   [mcsfile] [bitCount (decimal)]
                      [options] [clk1Count] [clk2Count]
-Calls C98ReadCapture ( );
-No equivalent 8051 command.
DOWNLOAD_OFFSETS           [offset file]
                           [offset count (decimal)]
-Calls C98BinaryDownload ( ). Offset file should
  contain 1 offset per line specified in ASCII hex.
-No equivalent 8051 command.
WRITE_BYTE_SELMAP          [data]
-Calls C9BWriteSelectMAP ( ). Only 1 byte is allowed
  to be written.
-Equivalent to the 8051 assembly command
  'movx @Ri, A'
INITIALIZE_TAP             (no args)
-Calls C98JTAGInitializeTAP ( ).
-Equivalent to multiple 8051 assembly commands setb,
  clr, and movx used to toggle the 3 JTAG lines of an
  FPGA or CPLD.
NAVIGATE_TAP_STATE         [state] [delay (decimal)]
-Calls C98JTAGNavigateTAPState ( ). Delay must be
  specified in uS.
-Specify state using the following table:
     /* JTAG TAP States */
        TAP_TEST_LOGIC_RESET                  00
        TAP_RUN_TEST_IDLE                     01
        TAP_SELECT_DR_SCAN                    02
        TAP_CAPTURE_DR                        03
        TAP_SHIFT_DR                          04
        TAP_EXIT1_DR                          05
        TAP_PAUSE_DR                          06
        TAP_EXIT2_DR                          07
        TAP_UPDATE_DR                         08
        TAP_SELECT_IR_SCAN                    09
        TAP_CAPTURE_IR                        0A
        TAP_SHIFT_IR                          0B
        TAP_EXIT1_IR                          0C
        TAP_PAUSE_IR                          0D
        TAP_EXIT2_IR                          0E
        TAP_UPDATE_IR                         0F
```

```
-continued

-Equivalent to the above in INITIALIZE_TAP
JTAG_SHIFT_BITS            [data] [bitCount (dec)]
                           [shiftMode] [exitShiftState]
-Calls C98JTAGShiftBits ( ). The data is limited to 4
 system, msb.specified first. (ex. 0 x 12345678, 78h
 will be shifted out first, beginning from the right
 side.
-Specify shiftMode using the following table:
    /* JTAG Shift Modes */
    JTAG_SHIFT_WRITE                              1
    JTAG_SHFIT_READ_WRITE                         2
    JTAG_SHFIT_READ                               3
-Specify exitShiftState = 1 if the shift state will
 be exited when shifting the last bit.
```

A specific instance of a configuration control file generator is set forth in Appendix A. The example control file generator is a Perl script that is generally comprised of a series of "print" statements that output specific configuration commands to a file. The collective functions of the commands are for configuring an FPGA in SelectMAP mode, followed by reading back configuration data. While the example control file generator shows a script of commands being generated, it will be appreciated that the generator could be adapted to generate different types of control files. For example, an assembly language or a C language control file could be generated instead of the command script. The example command script that is generated by the program of Appendix A is set forth in Appendix B.

Appendix A shows an exemplary configuration control file generator 106 implemented as a Perl script. In other embodiments of the invention, configuration control file generator 106 is implemented as a Java application, a Java applet, a Microsoft Foundation class GUI, or another type of graphical user interface program. Alternatively, the control file generator can be implemented as a command line executable, e.g., as a DOS or Unix executable.

Figure 2:
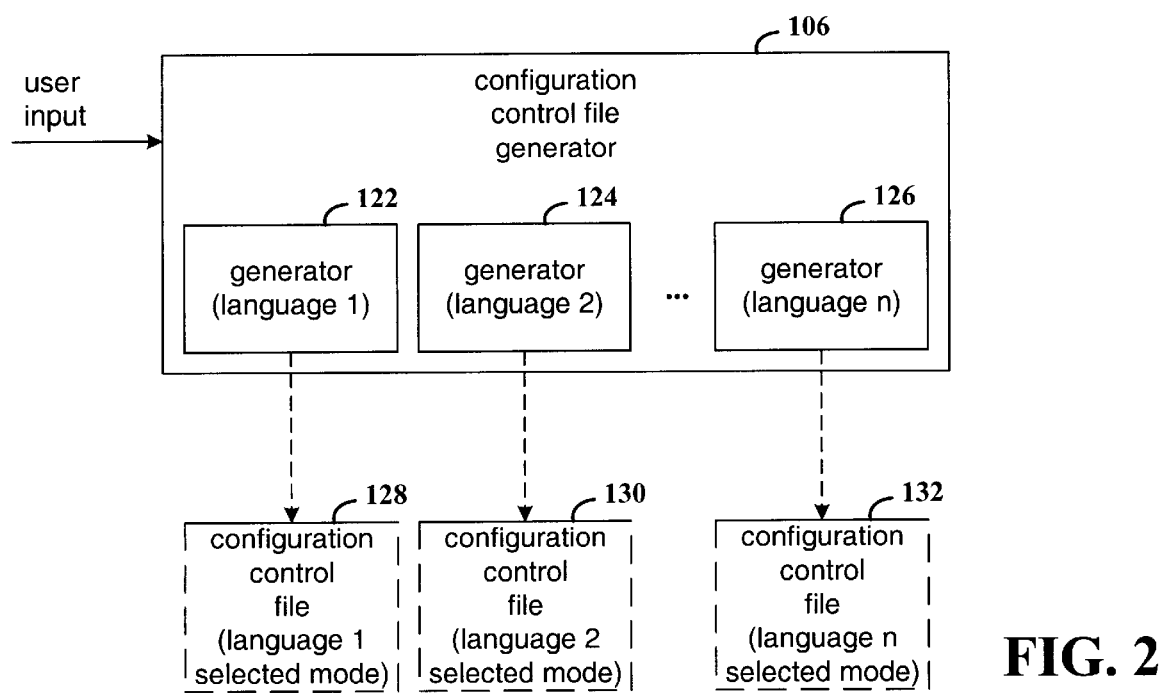
FIG. 2 is a functional block diagram of an example configuration control file generator.

FIG. 2 is a functional block diagram of a configuration control file generator in accordance with another embodiment of the invention. Configuration control file generator 106 supports generating different types of control files based on a selected language and configuration mode. For example, different programming languages such as assembly, C, or a specific command language may be used to specify the control directives in the control file. In addition, a particular PLD may have different configuration modes. For example, the Virtex FPGA from Xilinx has as possible configuration modes: slave-serial, master-serial, SelectMAP, and boundary-scan.

Generators 122, 124, ... 126 are programmed to generate respective control files 128, 130, ... 132 in different languages. For example, generator 122 may be programmed to generate a C language control file, and generator 126 may be programmed to generate an assembly language control file.

For generating a control file suitable for a particular configuration mode, each generator may be programmed to generate a control file in the designated language with directives suitable for a selected configuration mode. For example, the user may provide data to control file generator 106 that selects both the language and configuration mode. In response, the appropriate one of generators 122, 124, ... 126 is invoked with a parameter that specifies the configuration mode. In another embodiment, each of the generators may be programmed to generate a control file in a particular language for a particular configuration mode.

Figure 3:
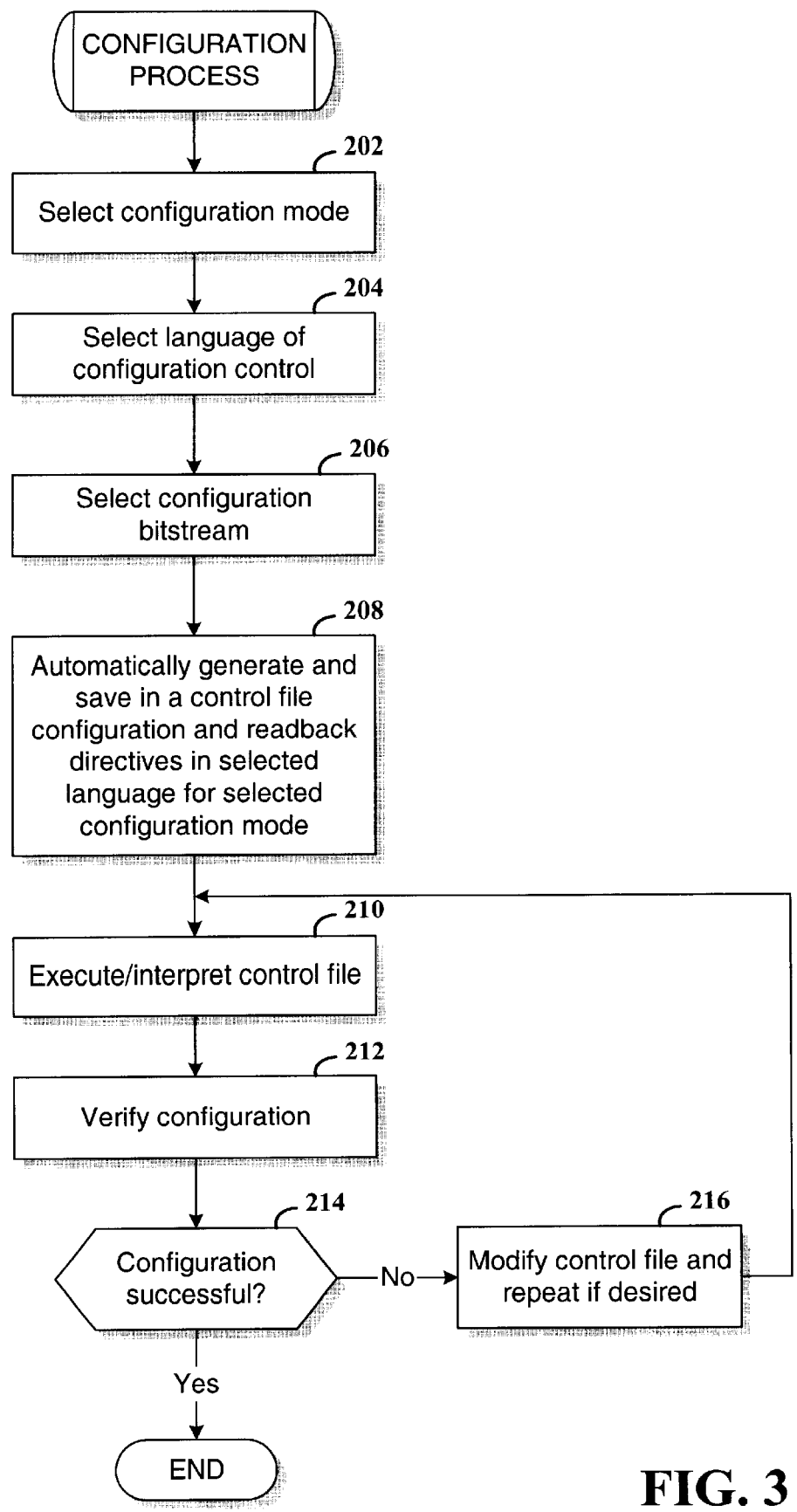
FIG. 3 is a flowchart of a process for configuring a PLD in accordance with one embodiment of the invention.

FIG. 3 is a flowchart of a process for configuring a PLD in accordance with one embodiment of the invention. The process generally entails automatically generating a configuration control file, performing the directives in the configuration control file, and verifying whether the configuration was successful. Automatically generating a configuration control file saves the user from having to learn the details of the different configuration modes for a PLD and from having to learn the details of the configuration directives.

The configuration mode, the language of the configuration control directives, and the configuration bitstream are selected at steps 202, 204, and 206. Depending on the particular PLD and the available configuration interface tools (not shown), the available languages and configuration modes will vary.

At step 208, the configuration control file is automatically generated. For example, the control file generator program of Appendix A, or an adaptation thereof, may be used to generate the control file. The particular directives and sequence of directives is determined by the configuration mode as selected at step 202, and the language of the control directives is that selected at step 204. It will be appreciated that in another embodiment there may be only a single configuration mode and/or language available, thereby eliminating the selection steps.

At step 210, the directives of the configuration control file are performed either by execution or interpretation, depending on the selected language.

If the control file also includes directives for reading back configuration data, then the configuration can be verified at step 212. It will be appreciated that many applications will require verification of a valid configuration. However, there may be instances where verification is not required. Therefore, the readback directives in the control file may be optional. Verification of a configuration is generally accomplished by comparing the input configuration bitstream to the readback configuration data. If the data are equal, then the configuration is valid.

If the configuration was not successful, decision step 214 directs control to step 216, where the user can optionally modify the control file. Control is then returned to step 210 for another attempt at configuration. The process is complete once the PLD has been successfully configured.

The present invention is believed to be applicable to a variety of systems for configuring PLDs and has been found to be particularly applicable and beneficial in configuring Virtex FPGAs in SelectMAP mode. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for configuring a programmable logic device with a configuration bitstream, comprising:
    selecting a language from a predetermined set of languages;
    automatically creating a control file having directives in the selected language for controlling configuration of the programmable logic device; and
    responsive to interpretation of the directives, applying control signals to the programmable logic device and loading the configuration bitstream into the programmable logic device.

2. The method of claim 1, wherein the predetermined set of languages includes an assembly language.

3. The method of claim 1, wherein the predetermined set of languages includes a high-level programming language.

4. The method of claim 1, wherein the predetermined set of languages includes a command language.

5. The method of claim 1, further comprising selecting a configuration mode from a plurality of configuration modes, and wherein the directives in the control file conform to the selected configuration mode.

6. The method of claim 5, wherein the predetermined set of languages includes an assembly language.

7. The method of claim 5, wherein the predetermined set of languages includes a high-level programming language.

8. The method of claim 5, wherein the predetermined set of languages includes a command language.

9. The method of claim 1, further comprising:
automatically creating in the control file directives in the selected language for controlling readback of configuration data from the programmable logic device; and
reading back configuration data from the programmable logic device in response to interpretation of the directives for controlling readback in conjunction with applying the control signals.

10. The method of claim 9, wherein the predetermined set of languages includes an assembly language.

11. The method of claim 9, wherein the predetermined set of languages includes a high-level programming language.

12. The method of claim 9, wherein the predetermined set of languages includes a command language.

13. The method of claim 9, further comprising selecting a configuration mode from a plurality of configuration modes, and wherein the directives in the configuration control file conform to the selected configuration mode.

14. An apparatus for configuring a programmable logic device with a configuration bitstream, comprising:
means for selecting a language from a predetermined set of languages;
means for automatically creating a control file having directives in the selected language for controlling configuration of the programmable logic device; and
means for interpreting the directives in the control file, applying control signals to the programmable logic device responsive to the directives, and loading the configuration bitstream into the programmable logic device in response to the directives.

15. The apparatus of claim 14, further comprising means for selecting a configuration mode from a plurality of configuration modes, and wherein the directives in the configuration control file conform to the selected configuration mode.

16. A system for configuring a programmable logic device, comprising:
a host data processing system configured and arranged with a configuration control file generator and a configuration engine,
wherein the configuration control file generator is configured and arranged to select a language from a predetermined set of languages and automatically create a control file having directives in the selected language for controlling configuration of the programmable logic device, and
wherein the configuration engine is configured and arranged to interpret the directives and generate configuration control signals responsive to the directives; and
an interface device coupled to the host data processing system and having pins for connecting to the programmable logic device, wherein the interface device is arranged to apply control and configuration signals to the programmable logic device responsive to the configuration control signals from the configuration engine.

17. The system of claim 16, wherein the configuration control file generator is further configured and arranged to select a configuration mode from a plurality of configuration modes and generate directives in the configuration control file conforming to the selected configuration mode.

18. The system of claim 16,
wherein the configuration control file generator is further configured and arranged to automatically create in the control file directives in the selected language for controlling readback of configuration data from the programmable logic device; and
the configuration engine is further configured and arranged to generate readback control signals for reading back configuration data from the programmable logic device in response to the directives for controlling readback.

* * * * *